United States Patent
Freytag

(10) Patent No.: US 10,295,621 B2
(45) Date of Patent: May 21, 2019

(54) HF RESONATOR ASSEMBLY

(71) Applicant: Bruker BioSpin AG, Faellanden (CH)

(72) Inventor: Nicolas Freytag, Binz (CH)

(73) Assignee: BRUKER BIOSPIN AG, Faellanden (CH)

(*) Notice: Subject to any disclaimer, the term of this patent is extended or adjusted under 35 U.S.C. 154(b) by 50 days.

(21) Appl. No.: 15/794,766

(22) Filed: Oct. 26, 2017

(65) Prior Publication Data
US 2018/0120389 A1 May 3, 2018

(30) Foreign Application Priority Data

Oct. 27, 2016 (DE) .................. 10 2016 221 161

(51) Int. Cl.
G01R 33/34 (2006.01)
H01P 7/00 (2006.01)
G01R 33/341 (2006.01)
G01R 33/36 (2006.01)

(52) U.S. Cl.
CPC ..... G01R 33/34092 (2013.01); G01R 33/341 (2013.01); G01R 33/34023 (2013.01); G01R 33/34046 (2013.01); G01R 33/3628 (2013.01); H01P 7/00 (2013.01); G01R 33/34061 (2013.01); G01R 33/3635 (2013.01)

(58) Field of Classification Search
CPC ........ G01R 33/34092; G01R 33/34046; G01R 33/34023; G01R 33/3628; G01R 33/341; G01R 33/3635; G01R 33/34061; H01P 7/00; H01P 7/005; H01P 7/06

USPC ................. 333/219, 227, 230, 231
See application file for complete search history.

(56) References Cited

U.S. PATENT DOCUMENTS

| | | | |
|---|---|---|---|
| 6,054,855 A | 4/2000 | Anderson | |
| 6,201,392 B1 | 3/2001 | Anderson et al. | |
| 6,727,700 B2 | 4/2004 | Marek | |
| 2002/0190715 A1* | 12/2002 | Marek | G01R 33/34046 324/318 |
| 2003/0052682 A1 | 3/2003 | Withers | |

(Continued)

FOREIGN PATENT DOCUMENTS

DE 10118835 A1 10/2002
JP 2001513200 A 8/2001

(Continued)

Primary Examiner — Rakesh B Patel
Assistant Examiner — Jorge L Salazar, Jr.
(74) Attorney, Agent, or Firm — Edell, Shapiro & Finnan, LLC

(57) ABSTRACT

An HF resonator assembly generates at least two independent alternating magnetic fields in a test volume of a magnetic resonance apparatus. The HF resonator assembly includes a first pair of flat coils that form a first HF resonator and comprise electrical conductor portions that surround a planar surface portion. The flat coils are arranged on opposing sides of the test volume, on coil support plates that are mutually parallel and in parallel with the longitudinal axis. A second pair of flat coils forms a second HF resonator on second coil support plates. The projections of the planar surface portions of the flat coils in each of the first pair of flat coils and the second pair of flat coils overlap in part, but not completely, when viewed in a direction perpendicular to the respective planar surface portions.

18 Claims, 3 Drawing Sheets

(56) References Cited

U.S. PATENT DOCUMENTS

2012/0242338 A1  9/2012  Freytag
2013/0178367 A1  7/2013  Tsuji et al.

FOREIGN PATENT DOCUMENTS

JP   2012202994 A   10/2012
JP   2013140128 A   7/2013

* cited by examiner

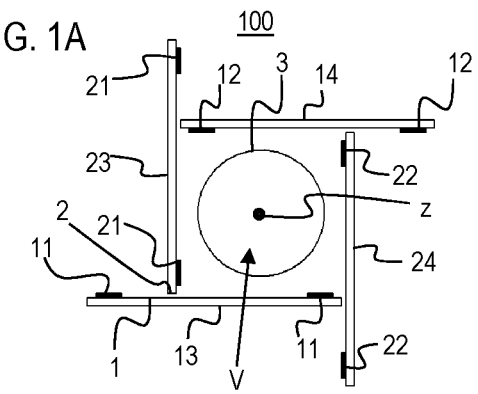
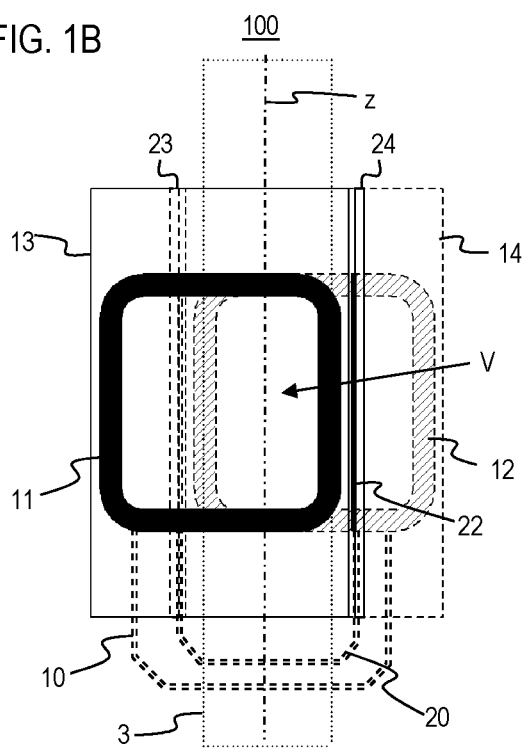

HF RESONATOR ASSEMBLY

CROSS REFERENCE TO RELATED APPLICATIONS

This application claims foreign priority under 35 U.S.C. § 119(a)-(d) to German Application No. 10 2016 221 161.7 filed on Oct. 27, 2016, the entire contents of which are hereby incorporated into the present application by reference.

FIELD OF THE INVENTION

The present invention relates to an HF resonator assembly for generating at least two independent alternating magnetic fields in a test volume of a magnetic resonance apparatus, which test volume extends along a longitudinal axis. In other aspects, the invention relates to a measurement probe comprising the HF resonator assembly, and to a magnetic resonance apparatus comprising the HF resonator assembly.

BACKGROUND

Nuclear Magnetic Resonance (NMR) spectroscopy is an instrumental analysis method enabling the determination of the chemical composition of samples. In this process, high-frequency (HF) pulses are radiated into the sample, which is located in a strong, homogeneous static magnetic field $B_0$, and the electromagnetic reaction of the sample is measured.

The high-frequency pulses are radiated in and the reaction, which is also in the high-frequency range, is measured by a measurement probe. Generally, measurement probes are employed in superconducting magnet systems in which the homogeneous static magnetic field $B_0$ is oriented along a "bore."

The samples to be analyzed, comprising liquid, powdery, gelatinous substances, but also tissue samples, single crystals, glasses, or mixtures of different substances, may be loaded into cylindrical, in particular circular cylindrical, sample containers. This sample container is inserted into a recess in the measurement probe provided for receiving samples. HF transmitter/receiver assemblies in the form of HF coils or HF resonators are arranged around this recess in the measurement probe. The HF assemblies generate alternating electromagnetic fields in the recess, and thus in the inserted sample, when HF signals are applied to the HF assemblies. The alternating electromagnetic fields that are emitted by the nuclear spins in the sample as a reaction to the excitation are in turn received by elements of the HF transmitter/receiver assembly. The test volume of the magnetic resonance apparatus is defined by the intersection of the volume having a homogeneous static magnetic field $B_0$, the sample volume, and the volume in which the alternating magnetic fields of the HF assembly are sufficiently strong.

Typically, an NMR experiment employs the same HF coil and/or the same HF resonator to excite the nuclear spins, i.e. as a transmitter coil and/or transmitter resonator, and to detect signals in a later phase of the NMR experiment, i.e. as a receiver coil and/or receiver resonator. In so doing, the corresponding HF paths of the NMR spectrometer are correspondingly switched from an HF transmitter to a preamplifier and HF receiver. Corresponding switching devices are known. According to the known principle of reciprocity, an HF resonator that is suitable for generating an alternating magnetic field in a test volume is also suitable for receiving alternating magnetic fields from the test volume. Likewise, an HF resonator that is suitable for generating an alternating electric field in a test volume is also suitable for receiving alternating electric fields from the test volume.

Owing to the extremely small signals to be measured during NMR experiments, the sensitivity in the detection phase often has especially high importance during the design of a coil assembly. An NMR measurement probe usually has one, and optionally two, preferred frequencies that are used for detection. Additional frequencies are utilized primarily for transmitting decoupling pulses and/or for polarization transfers.

HF resonators that are tuned to the NMR resonant frequency of the nuclear spin to be measured (for example, the nuclear species $^1H$, $^{13}C$, $^{15}N$, $^2H$, $^{19}F$) provide particularly high sensitivity when receiving signals. In general, it is favorable for the sensitivity for the HF resonator to be arranged as close as possible to the sample. If two different nuclear species that have different NMR resonant frequencies, e.g. $^1H$ and $^{13}C$, or $^1H$ and $^{19}F$, are both to be examined with high sensitivity, suitable geometric arrangement of the HF resonators may be required.

Hereafter, definitions will be provided for important terms as they are used in the present description and in the claims A "coil" is understood to be a continuous electrical conductor or a resonant structure having conductor portions and capacitive portions and components. A coil is arranged around a region in at least one winding.

A "flat coil" is understood to be a coil in which the conductors or conductor portions are arranged along a planar surface. In this case, one or more windings of the coil surround a region on the planar surface, which is also referred to herein as the "planar surface portion." The planar surface portion may be, for example, in the shape of a rectangle or any polygon, optionally having rounded corners. When there are wide strip conductors or multiple windings, the current concentration on a strip conductor or the current concentration of adjacent conductor elements of multiple windings should be taken into account to determine a position or a dimension of the flat coil.

The term "axis of a coil" is understood to mean an axis through the region around which the windings of the coil are arranged and relative to which a winding direction of the coil is defined. A magnetic field generated by energizing the coil is oriented in the center of the coil approximately in the axial direction of the axis of the coil.

A "plate" is understood to be a planar component that has a greater extent in two directions in parallel with a plane than in a third direction that is perpendicular to the plane. An end face of a plate is understood to be a surface that defines the plate and extends substantially in parallel with the plane. An edge surface of a plate is understood to be a surface that defines the plate and is not an end face.

In one example of a prior art (e.g., German Patent reference DE 10118835 A1), an HF resonator assembly generates two independent alternating magnetic fields in a test volume. The test volume is delimited by a cylindrical sample tube, i.e., the sample tube extends along a central longitudinal axis. The HF resonator assembly comprises a first and a second resonator which are both arranged close to the test volume. This HF resonator assembly comprises a first pair of flat coils that are connected to form a first HF resonator. These flat coils are arranged on first coil support plates that are mutually parallel and in parallel with the longitudinal axis. These first coil support plates are positioned on opposing sides of the test volume. The HF resonator assembly further comprises a second pair of flat coils that are connected to form a second HF resonator and that are on second coil support plates that are mutually parallel and in parallel with the longitudinal axis. The second coil support plates are perpendicular to the first coil support plates and are likewise arranged on opposing sides of the test volume. Each end face of a coil support plate, i.e., a surface that is perpendicular to the coil axis of the particular flat coil, faces an edge surface of an adjacent coil support plate. The four coil support plates thus define a space that surrounds the test volume and is in the shape of a prism having a square or rectangular base. The coil support plates each project beyond this base in different directions. This example arranges the flat coils on the coil support plates such that a group of conductor structures extending in parallel with the longitudinal axis is arranged as close as possible to the test volume. This results in an assembly in which the flat coils associated with one HF resonator are arranged on one side of the longitudinal axis in each case when viewed perpendicularly to the coil support plates of said flat coils.

FIG. 5A is a cross section and FIG. 5B is the corresponding plan view of an HF resonator assembly according to the prior art disclosed in DE 10118835 A1. The flat coils 11 and 12, and likewise the flat coils 21 and 22, do not overlap in this case. This is because, according to the teaching of DE 10118835 A1, there must be longitudinal conductor elements on each flat coil that are arranged as close as possible to the test volume.

SUMMARY

Typical NMR experiments, e.g., for examining biomolecules, may include triple-resonance experiments which operate at three different frequencies (e.g., the resonant frequencies of the nuclei $^1$H, $^{13}$C, $^{15}$N that are important in biomolecules). Typically, when taking the measurements, one nuclear species (e.g., $^2$H) and one associated HF channel are provided for monitoring and keeping constant the static magnetic field $B_0$. This process is referred to as a locked control loop. Moreover, gradient coils are typically used for the pulsed application of magnetic field gradients in the test volume. All these further elements should be attached close to the test volume, and they compete with one another in this regard. A compact design of one part of the HF resonator assembly often conflicts with other desirable properties of the remainder of the HF resonator assembly, such as high sensitivity, minimizing coupling between the different HF channels, or homogeneity in the generated alternating magnetic field in the test volume.

It would be desirable to accommodate further HF resonators in an NMR measurement probe.

In contrast, the solution described herein provides, as cost-effectively as possible and with little technical outlay, an HF resonator assembly which has the features specified at the outset for generating at least two independent alternating magnetic fields in a test volume of a magnetic resonance apparatus, and overcomes at least one of the above-mentioned disadvantages of the prior art.

This problem is solved by the HF resonator described herein that generates at least two independent alternating magnetic fields in a test volume of a magnetic resonance apparatus. The HF resonator assembly according to the invention comprises a first pair of flat coils that are connected to form a first HF resonator and comprise electrical conductor portions that surround a planar surface portion. The flat coils are arranged on opposing sides of the test volume, on first coil support plates that are mutually parallel and in parallel with the longitudinal axis. The HF resonator further comprises a second pair of flat coils that are connected to form a second HF resonator and comprise electrical conductor portions that surround a planar surface portion. The flat coils are arranged on opposing sides of the test volume, on second coil support plates that are mutually parallel and in parallel with the longitudinal axis and perpendicular to the first coil support plates. Each end face of a coil support plate faces an edge surface of an adjacent coil support plate.

As described herein, the projections of the planar surface portions of the first pair of flat coils overlap in part, but not completely, when viewed in a direction perpendicular to the planar surface portions of the first pair of flat coils. Similarly, the projections of the planar surface portions of the second pair of flat coils overlap in part, but not completely, when viewed in a direction perpendicular to the planar surface portions of the second pair of flat coils.

The fact that the flat coils overlap only in part is to be understood to mean that the region surrounded by one of the flat coils in question overlaps in part with the region surrounded by the other flat coil in each case, and that each of the flat coils in question also comprises a portion of the surrounded region that does not overlap with the other flat coil. It is sufficient for the overlap for the regions surrounded by the line of the current concentrations to overlap.

This HF resonator assembly surprisingly results in higher sensitivity at the resonant frequencies of the first and second HF resonator compared with the assembly known from the prior art. Furthermore, the homogeneity of the alternating magnetic field generated by the first and second HF resonators in the test volume is increased. This has the advantage that the nuclear spins undergo substantially the same deflection in the entire test volume when HF pulses are applied by the HF resonators. If the magnetic field intensities generated by an HF resonator on a circumference of a circle around the longitudinal axis are considered as a function of the position on the circumference, it is possible to identify a reduction in the deviation of the field intensities from the average value thereof compared with the prior art.

A further advantage of the HF resonator assembly described herein that is surprising to a person skilled in the art is the particularly efficient suppression of the solvent spectral lines when using one of the HF resonators, e.g., tuned to the $^1$H resonant frequency, for solvent suppression by means of pre-saturation in NMR experiments. At the edges of the test volume, the magnetic field distribution generated by HF resonators in the assembly described herein has an edge in the magnetic field intensity that drops off steeply towards the longitudinal axis. In the transition region defined by the edge in the magnetic field intensity, the suppression effect of the pre-saturation pulse is no longer fully provided, whereas there is still a residual sensitivity to remaining solvent signals. A transition region accompanied by an edge that drops off steeply and having a small volume are advantages provided by the assembly described herein.

In one example of the HF resonator assembly, the flat coils are constructed from conductor structures having longitudinal conductor elements that extend in parallel with the longitudinal axis. The flat coils also have transverse conductor elements that are transverse to the longitudinal axis. These conductor elements border a window that is free of conductor structures.

This example is a particularly simple and effective form of flat coils. The longitudinal conductor elements, which are energized during operation, very efficiently generate an alternating magnetic field in the direction perpendicular to the longitudinal axis. In the transmission of HF pulses, only the component of the alternating magnetic field that is perpendicular to the static magnetic field is effective in the test volume. In a conventional assembly, the longitudinal axis of the test volume is in parallel with the static magnetic field of a magnetic resonance apparatus. The transverse conductor elements can close the circuit in the edge region of the test volume. In this embodiment, the overlap of the flat coils may be sufficiently large that the conductor structures in the windows do not overlap.

In another example of the HF resonator assembly, the flat coils are made of a metal (e.g., copper, silver, or aluminum), of a metal alloy, or of a high-temperature superconductor (e.g., a rare-earth barium cuprate). Using metals having higher conductivity or using a high-temperature superconductor results in higher resonator quality and thus results in higher sensitivity when receiving signals from the test volume. Yttrium barium cuprate (YBCO) is possible as the high-temperature superconductor, for example.

In a further example of the HF resonator assembly, coil support plates comprise one or more of the following materials: glass, quartz, a fluoropolymer (e.g., polytetrafluoroethylene), a ceramic (e.g., magnesium oxide or boron nitride), or sapphire (e.g., sapphire having a surface in parallel with a crystal plane, such as the R-plane). In this example, the dielectric loss of the HF resonators is minimized, which contributes to high sensitivity when signals are received. Sapphire having a surface in parallel with the R-plane is particularly suitable for the epitaxial growth of a conductor layer, in particular a YBCO layer.

In still another example of the HF resonator assembly, flat coils are constructed from conductor structures having breaks that are bridged by capacitors. The capacitors may be formed by conductor structures extending in parallel with one another, by branched, interdigitated conductor structures, and/or by overlapping conductor structures positioned on opposing sides of a coil support plate. In this example, at least a portion of the flat coils is already formed as a resonant structure per se, but only forms the first and/or second HF resonator having the desired definitive resonant frequency by being connected to the corresponding other flat coil of the. In this example, specified resonant frequencies of the first and of the second HF resonator may span a wide range, largely independently of the outer dimensions of the flat coils, by suitably determining the distributed capacitors and the number of windings of the flat coils. In particular, the positioning of the capacitors may be freely selected and may be either symmetrical or asymmetrical.

In one example of the HF resonator assembly, an HF resonator may be formed by a galvanic connection and/or transformer coupling of the flat coils.

One example of the HF resonator assembly comprises at least one further pair of flat coils that are connected to form a further HF resonator. The further pair(s) of flat coils are on further coil support plates on opposing sides of the first coil support plates, which are mutually parallel and in parallel with the longitudinal axis. In this example, the advantage of the flat coils of the first and second HF resonator that overlap in part is that, in the case of specified coil dimensions, further flat coils that are positioned outside the first coil support plates with respect to the test volume can be attached closer to the test volume than in the case of flat coils that do not overlap. This means that increasing the sensitivity of the first and second resonator is not to the detriment of the further resonator. On the contrary, the sensitivity of the further resonator can also be further increased on account of being positioned closer to the test volume.

In another example of the HF resonator assembly, the flat coils of the further pair overlap completely or in part when viewed perpendicularly to the end faces of the further coil support plates. When arranging the pair of flat coils of the further resonator, it is possible for there to be a complete overlap when viewed in the direction of the coil axes, which corresponds to what is known as a Helmholtz arrangement. In this example of the HF resonator assembly, the homogeneity of the alternating magnetic field generated by the further HF resonator may be maximized in the test volume. Alternatively, the flat coils may partially overlap in an offset arrangement of the further coil support plates, which is particularly favorable if yet another further (i.e., fourth) pair of flat coils is to be attached as close as possible to the test volume.

A further example of the HF resonator assembly comprises a third pair of flat coils that are connected to form a third HF resonator. The third pair of flat coils are on third coil support plates that are mutually parallel and in parallel with the longitudinal axis. A fourth pair of flat coils are connected to form a fourth HF resonator. The fourth pair of flat coils are on fourth coil support plates that are mutually parallel and in parallel with the longitudinal axis. The first HF resonator may be inductively decoupled from both the second HF resonator and the fourth HF resonator. The third HF resonator may be inductively decoupled from both the second HF resonator and the fourth HF resonator.

Surprisingly, the fields generated by the HF resonators do not need to be mutually orthogonal in the measuring volume in order to achieve inductive decoupling of the HF resonators. Thus, according to this example, each HF resonator from a group consisting of the first HF resonator and the third HF resonator is inductively decoupled from each HF resonator of a group consisting of the second HF resonator and the fourth HF resonator.

In yet another example of the HF resonator assembly, the third coil support plates are arranged in parallel with the first coil support plates, and the fourth coil support plates are arranged in parallel with the second coil support plates. In this assembly, the mutual inductance is decoupled between almost all pair combinations of the first to the fourth resonator (apart from those of the first resonator with the third resonator, and the second resonator with the fourth resonator) simply by the symmetry of the assembly.

In a further example, a measurement probe may include an HF resonator assembly as described herein. In this measurement probe, a first HF input may be coupled to the first HF resonator at a high frequency via a first tuning network, and a second HF input may be coupled to the second HF resonator at a high frequency via a second tuning network. The HF resonator assembly provides a measurement probe of this kind (e.g., an NMR sample head) in an immediately usable form for the user. The tuning network may be connected to the HF resonators by inductive or capacitive coupling elements. In particular, the relevant pair of flat coils may be transformer coupled. An HF connection to the coil pair may be achieved by inductively coupled coils. On the HF resonator side, one or both flat coils, or alternatively an additional coil that is connected in series with the HF resonators, may be able to act as a coupling partner for the tuning network. The tuning network may comprise adjustable elements, for example trimmers, by which the resonant frequencies of the first HF resonator and the second HF resonator, which also depend inter alia on the sample inserted into the test volume, can be readjusted. Adjustable inductively coupled elements may likewise be provided in order to adapt the resonant frequency or the impedance. The HF inputs may be connections for coaxial cables, for example.

In a further aspect, a magnetic resonance apparatus may include an HF resonator assembly described herein or may include a measurement probe described herein. The HF resonator assembly may be built into the magnetic resonance apparatus. The magnetic resonance apparatus may, for example, comprise a device for generating a static magnetic field having a magnetic field direction that is parallel to the longitudinal axis of the test volume.

In one example of the magnetic resonance apparatus, the first HF resonator and the second HF resonator are each operatively connected in a controllable way to a first HF transmitting unit and a second HF transmitting unit. In this example, temporally pulsed alternating magnetic fields may be induced in the test volume of the magnetic resonance apparatus, and thus in a sample located in the test volume, by appropriately activating the operative connection between the respective HF transmitting units and the corresponding HF resonator.

BRIEF DESCRIPTION OF THE DRAWINGS

Embodiments of the present invention are described in greater detail below with reference to the figures, in which:

FIG. 1A is a cross section through an HF resonator assembly according to an example embodiment;

FIG. 1B is a plan view of an HF resonator assembly according to an example embodiment;

DETAILED DESCRIPTION

Figure 2:
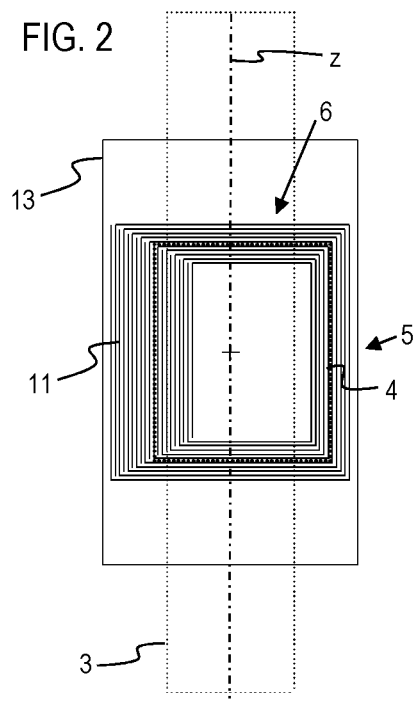
FIG. 2 shows a flat coil according to an example embodiment.

FIG. 1A is a cross section, perpendicular to a central longitudinal axis z, through an HF resonator assembly 100. Coil support plates 13, 14, 23, 24 are arranged around a test volume V. An end face 1 of each of the coil support plates faces an edge surface 2 of an adjacent coil support plate. For the sake of clarity, the mutually facing end face 1 and edge surface 2 have been provided with reference signs only for the adjacent coil support plates 13 and 23. First coil support plates 13, 14 are positioned on opposing sides of the test volume V, so as to be in parallel with the longitudinal axis z and so as to be mutually parallel. Second coil support plates 23, 24 are perpendicular to the first coil support plates 13, 14. The second coil support plates 23, 24 are likewise positioned on opposing sides of the test volume V, so as to be in parallel with the longitudinal axis z and so as to be mutually parallel. A flat coil 11, 12, 21, 22 is arranged on each coil support plate 13, 14, 23, 24, respectively. The cross section shown extends through longitudinal conductor elements of the flat coils that extend in parallel with the longitudinal axis.

FIG. 1B is a plan view of the HF resonator assembly 100. The viewing direction in this view is perpendicular to the end faces of the first coil support plates 13 and 14. The partial overlap of the flat coils 11 and 12 can be seen in this view. In this case, the overlap corresponds exactly to the projection of the test volume in the viewing direction. The flat coil 11 and the flat coil 12 are connected to form a first HF resonator 10, as shown schematically by the dashed double line. Likewise, the flat coil 21 and the flat coil 22 are connected to form a second HF resonator 20. The space 3 for receiving a sample is in the shape of a circular cylinder in this case, having a cylinder axis that coincides with the longitudinal axis z, and extends beyond the flat coils in the longitudinal direction. The space 3 for receiving a sample can be delimited by a wall, e.g., in order to allow the HF resonator assembly and the sample to be temperature-controlled at different temperatures, but the space 3 may also be defined by a sample holder and the geometry of the sample container.

FIG. 2 shows the flat coil 11 according to one example. The flat coil 11 is constructed from conductor structures that are attached to the coil support plate 13. The coil 11 has a plurality of windings. A coil window 4 is shown in accordance with the position of the current concentrations. Longitudinal conductor elements 5 and transverse conductor elements 6 border a rectangular region that does not include any conductor structures. Here, the longitudinal conductor elements are interdigitated on the left-hand side of the longitudinal axis z, as a result of which capacitors are formed that bridge breaks between the conductor structures at a high frequency. In the example shown in FIG. 2, the coil window covers the space 3 for receiving a sample. The coil window is asymmetrical to the longitudinal axis, and therefore a partial overlap would occur with a flat coil 12 (not shown) of the same shape that is rotated by 180° with respect to the longitudinal axis.

Figure 3:
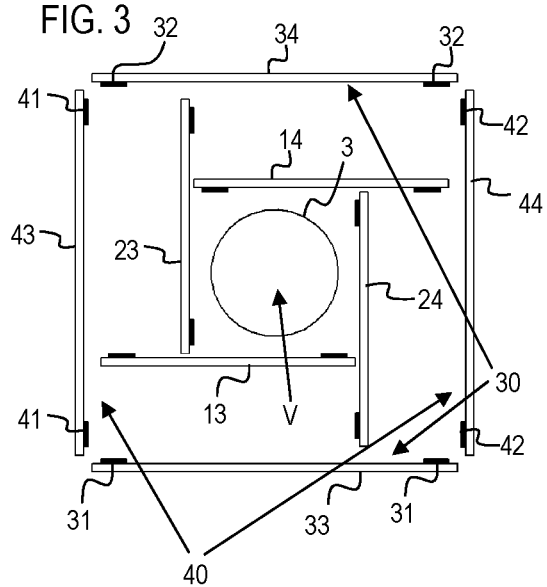
FIG. 3 is a cross section through an example embodiment of the HF resonator assembly.

FIG. 3 is a cross section through the HF assembly 100 which comprises, in addition to the first HF resonator and the second HF resonator, a third HF resonator 30 and a fourth HF resonator 40. For this purpose, third flat coils 31, 32 are arranged on third coil support plates 33, 34, and fourth flat coils 41, 42 are arranged on fourth coil support plates 43, 44. In the assembly shown in FIG. 3, the third and fourth flat coils each overlap completely when viewed in the direction perpendicular to the end faces of the coil support plates thereof, for example, the third HF resonator 30 and the fourth HF resonator are positioned in what is known as the Helmholtz arrangement. The HF resonators 10 and 30 can be inductively decoupled from the HF resonators 20 and 40.

Figure 4A:
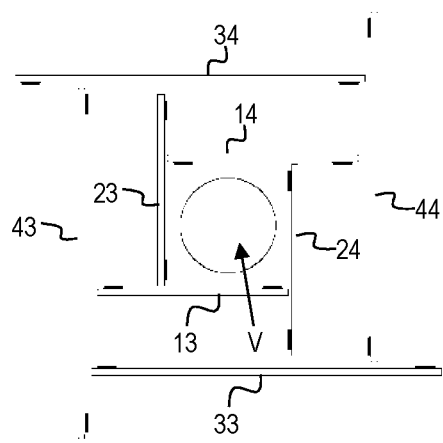
FIG. 4A and FIG. 4B are cross sections through further example embodiments of the HF resonator assembly.
Figure 4B:
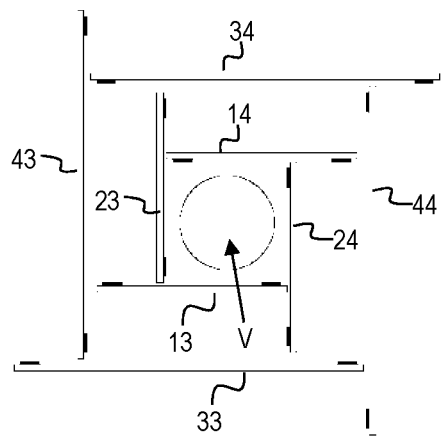
Figure 5A:
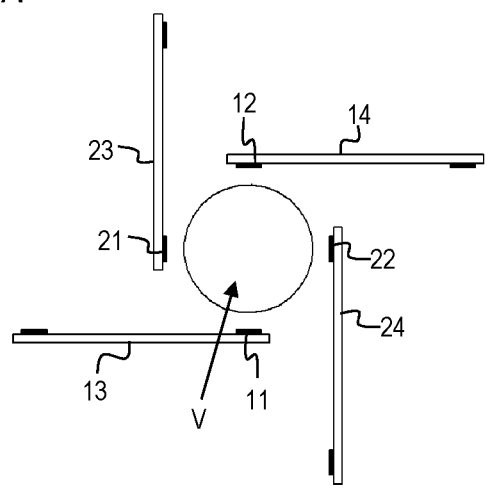
FIG. 5A is a cross section through an HF resonator assembly according to the prior art.
Figure 5B:
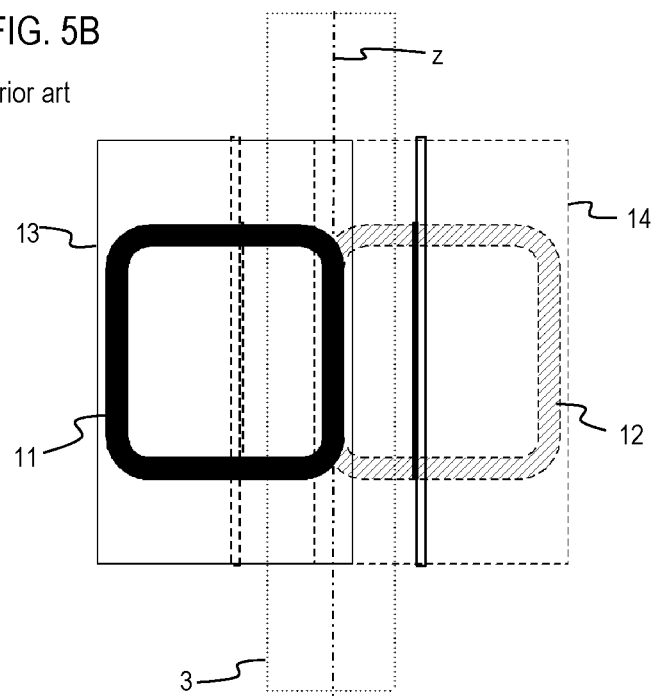
FIG. 5B is a plan view of an HF resonator assembly according to the prior art.

FIG. 4A and FIG. 4B are each a cross section through further examples of the HF assembly 100 comprising an additional third HF resonator and fourth HF resonator. For reasons of clarity, only the coil support plates are provided with reference signs here. In these two embodiments, the third and fourth flat coils each overlap in part, i.e. the arrangement of the third and fourth HF resonators with respect to one another, which are positioned further from the test volume than the first and second HF resonators, is similar to the inner arrangement of the first and the second HF resonators. In this example, the direction of rotation of the rosette formed by the outer assembly is diametrically opposed to the inner assembly in the case of FIG. 4A. In contrast, the direction of rotation of both rosettes is the same in FIG. 4B. In both FIG. 4a and FIG. 4B, the group consisting of the HF resonators 10 and 30 can be inductively decoupled from the group consisting of the HF resonators 20, 40.

The above description is intended by way of example only. Although the present disclosure has been described in detail with reference to particular arrangements and configurations, these example configurations and arrangements may be changed significantly without departing from the scope of the present disclosure.

LIST OF REFERENCE SIGNS 1 end face
2 edge surface
3 space for receiving a sample
4 coil window
5 longitudinal conductor element
6 transverse conductor element
10 first HF resonator
11, 12 flat coils (first pair)
13, 14 first coil support plates
20 second HF resonator
21, 22 flat coils (second pair)
23, 24 second coil support plates
30 third HF resonator
31, 32 flat coils (third pair)
33, 34 third coil support plates
40 second HF resonator
41, 42 flat coils (fourth pair)
43, 44 fourth coil support plates
100 HF resonator assembly
V test volume
z longitudinal axis

What is claimed is:

1. A high frequency (HF) resonator assembly comprising:
a test volume extending along a longitudinal axis;
a pair of first coil support plates arranged on opposing sides of the test volume, wherein the pair of first coil support plates are mutually parallel and in parallel with the longitudinal axis;
a first pair of flat coils that are configured to form a first HF resonator on the pair of first coil support plates;
a pair of second coil support plates arranged on opposing sides of the test volume, wherein the pair of second coil support plates are mutually parallel, in parallel with the longitudinal axis, and perpendicular to the pair of first coil support plates; and
a second pair of flat coils that are configured to form a second HF resonator on the pair of second coil support plates,
wherein each of the flat coils comprises respective electrical conductor portions that surround a respective planar surface portion,
wherein each coil support plate includes a respective end face facing a respective edge surface of an adjacent one of the coil support plates,
wherein projections of the planar surface portions of the first pair of flat coils overlap in part, but not completely, when viewed in a direction perpendicular to the planar surface portions of the first pair of flat coils, and
wherein projections of the planar surface portions of the second pair of flat coils overlap in part, but not completely, when viewed in a direction perpendicular to the planar surface portions of the second pair of flat coils.

2. The HF resonator assembly according to claim 1, wherein each of the flat coils are constructed from conductor structures having longitudinal conductor elements that extend parallel to the longitudinal axis and transverse conductor elements that are transverse to the longitudinal axis, wherein the longitudinal conductor elements and the transverse conductor elements border a window that is free of conductor structures.

3. The HF resonator assembly according to claim 1, wherein each of the flat coils are made of a metal or of a high-temperature superconductor.

4. The HF resonator assembly according to claim 3, wherein the metal comprises copper, silver, or aluminum.

5. The HF resonator assembly according to claim 3, wherein the high-temperature superconductor comprises a rare-earth barium cuprate.

6. The HF resonator assembly according to claim 1, wherein each of the coil support plates comprises one of the following materials: glass, quartz, a fluoropolymer, polytetrafluoroethylene, a ceramic, magnesium oxide, aluminum oxide, boron nitride, or sapphire.

7. The HF resonator assembly according to claim 6, wherein each of the coil support plates comprises sapphire having a surface in parallel with a crystal plane.

8. The HF resonator assembly according to claim 7, wherein the crystal plane is the R-plane.

9. The HF resonator assembly according to claim 1, wherein each of the flat coils are constructed from conductor structures having breaks that are bridged by capacitors, wherein the capacitors are formed by the conductor structures extending in parallel with one another, by branched conductor structures engaging in an interdigitated manner, or by overlapping conductor structures positioned on opposing sides of one of the coil support plates.

10. The HF resonator assembly according to claim 1, wherein the first HF resonator or the second HF resonator is formed by galvanic connection or transformer coupling of the respective flat coils.

11. The HF resonator assembly according to claim 1, further comprising at least one further pair of flat coils that are connected to form a further HF resonator on further coil support plates on opposing sides of the first coil support plates, wherein the further coil support plates are mutually parallel and extend in parallel with the longitudinal axis.

12. The HF resonator assembly according to claim 11, wherein the flat coils of the at least one further pair of flat coils overlap completely or in part when viewed perpendicularly to end faces of the further coil support plates.

13. The HF resonator assembly according to claim 11, wherein the at least one further pair of flat coils comprises a third pair of flat coils that are configured to form a third HF resonator and that are on third coil support plates that are mutually parallel and extend in parallel with the longitudinal axis, and a fourth pair of flat coils that are configured to form a fourth HF resonator and that are on fourth coil support plates that are mutually parallel and extend in parallel with the longitudinal axis,
wherein the first HF resonator is inductively decoupled from both the second HF resonator and the fourth HF resonator, and wherein the third HF resonator is inductively decoupled from both the second HF resonator and the fourth HF resonator.

14. The HF resonator assembly according to claim 13, wherein the third coil support plates are arranged in parallel with the first coil support plates and the fourth coil support plates are arranged in parallel with the second coil support plates.

15. A measurement probe comprising the HF resonator assembly according to claim 1 and further comprising at least two HF inputs, wherein a first HF input of the at least two HF inputs is coupled to the first HF resonator at a high frequency via a first tuning network, and wherein a second HF input of the at least two HF inputs is coupled to the second HF resonator at a high frequency via a second tuning network.

16. A magnetic resonance apparatus comprising the measurement probe according to claim 1.

17. A magnetic resonance apparatus comprising the HF resonator assembly according to claim 1.

18. The magnetic resonance apparatus according to claim 17, wherein the first HF resonator and the second HF resonator are operatively connected respectively to a first HF transmitting unit and a second HF transmitting unit.

* * * * *